United States Patent
Li et al.

(10) Patent No.: US 8,098,109 B2
(45) Date of Patent: Jan. 17, 2012

(54) DIFFERENTIAL VARACTOR CIRCUIT FOR A VOLTAGE CONTROLLED OSCILLATOR

(75) Inventors: Qiang Li, Irvine, CA (US); Shr-Lung Chen, Irvine, CA (US); Richard Chen, Diamond Bar, CA (US)

(73) Assignee: Broadcom Corporation, Irvine, CA (US)

( * ) Notice: Subject to any disclaimer, the term of this patent is extended or adjusted under 35 U.S.C. 154(b) by 91 days.

(21) Appl. No.: 12/460,989

(22) Filed: Jul. 27, 2009

(65) Prior Publication Data

US 2011/0018642 A1    Jan. 27, 2011

(51) Int. Cl.
  *H03B 1/00*    (2006.01)
(52) U.S. Cl. ............. 331/177 V; 331/36 C; 331/108 R; 331/16; 331/185; 331/175
(58) Field of Classification Search .................... 331/16, 331/177 V, 36 C, 108 R
  See application file for complete search history.

(56) References Cited

U.S. PATENT DOCUMENTS 7,098,751 B1 *  8/2006  Wong ...................... 331/177 V

* cited by examiner

*Primary Examiner* — Arnold Kinkead
(74) *Attorney, Agent, or Firm* — Farjami & Farjami LLP

(57) ABSTRACT

According to one exemplary embodiment, a differential varactor circuit for a voltage controlled oscillator having two differential outputs includes a first varactor having first and second terminals and a second varactor having first and second terminals. In the differential varactor circuit, each of the first and second terminals of the first varactor and each of the first and second terminals of the second varactor are coupled to one of the two differential outputs of the voltage controlled oscillator, thereby allowing a size of each of the first and second varactors to be reduced so as to increase varactor quality factor. Each of the first and second terminals of the first varactor can be coupled to one of the two differential outputs by a capacitor, and each of the first and second terminals of the second varactor can be coupled to one of the two differential outputs by a capacitor.

20 Claims, 5 Drawing Sheets

DIFFERENTIAL VARACTOR CIRCUIT FOR A VOLTAGE CONTROLLED OSCILLATOR

BACKGROUND OF THE INVENTION

1. Field of the Invention

The present invention is generally in the field of electrical circuits. More specifically, the present invention is in the field of oscillators and tuning circuits.

2. Background Art

Voltage controlled oscillators (VCOs), such as differential VCOs, can be utilized to provide operating frequencies for communications devices, such as cell phones, as well as other types of electronic devices. A VCO, such as a differential VCO, generally includes a transconductance (Gm) stage coupled to a tank circuit, which can include an inductor and a varactor circuit for tuning the output frequency of the VCO. For a VCO, such as a differential VCO, performance can be increased by reducing phase noise, which is inversely proportional to the quality factor (Q) of the VCO tank circuit. Thus, the phase noise of the VCO can be reduced by increasing the Q of the inductor and/or increasing the Q of the varactor circuit. The Q of the inductor can be increased, for example, by utilizing multiple metal layers to form the inductor. However, it is also important to increase the Q of the varactor circuit, particularly for VCO operation in the gigahertz frequency range.

A conventional varactor circuit for a VCO, such as a differential VCO, can include two varactors, where each varactor can be coupled between a control voltage and one of the differential outputs of the VCO, and where each of the varactors can be a metal oxide semiconductor (MOS) varactor, such as an accumulation mode MOS (AMOS) varactor or an inversion mode MOS (IMOS) varactor. The Q of each varactor is inversely proportional to the capacitance of the varactor, which is proportional to the varactor gate area. Thus, the Q of each varactor in the conventional varactor circuit can be increased by reducing the capacitance of the varactor. However, the tuning gain of the VCO is proportional to the capacitance that the varactors present to the tank circuit. Thus, reducing the capacitance of the varactors to increase the Q of the conventional varactor circuit can reduce the VCO tuning gain, which is undesirable.

SUMMARY OF THE INVENTION

A differential varactor circuit for a voltage controlled oscillator substantially as shown in and/or described in connection with at least one of the figures, as set forth more completely in the claims.

DETAILED DESCRIPTION OF THE INVENTION

The present invention is directed to a differential varactor circuit for a voltage controlled oscillator. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
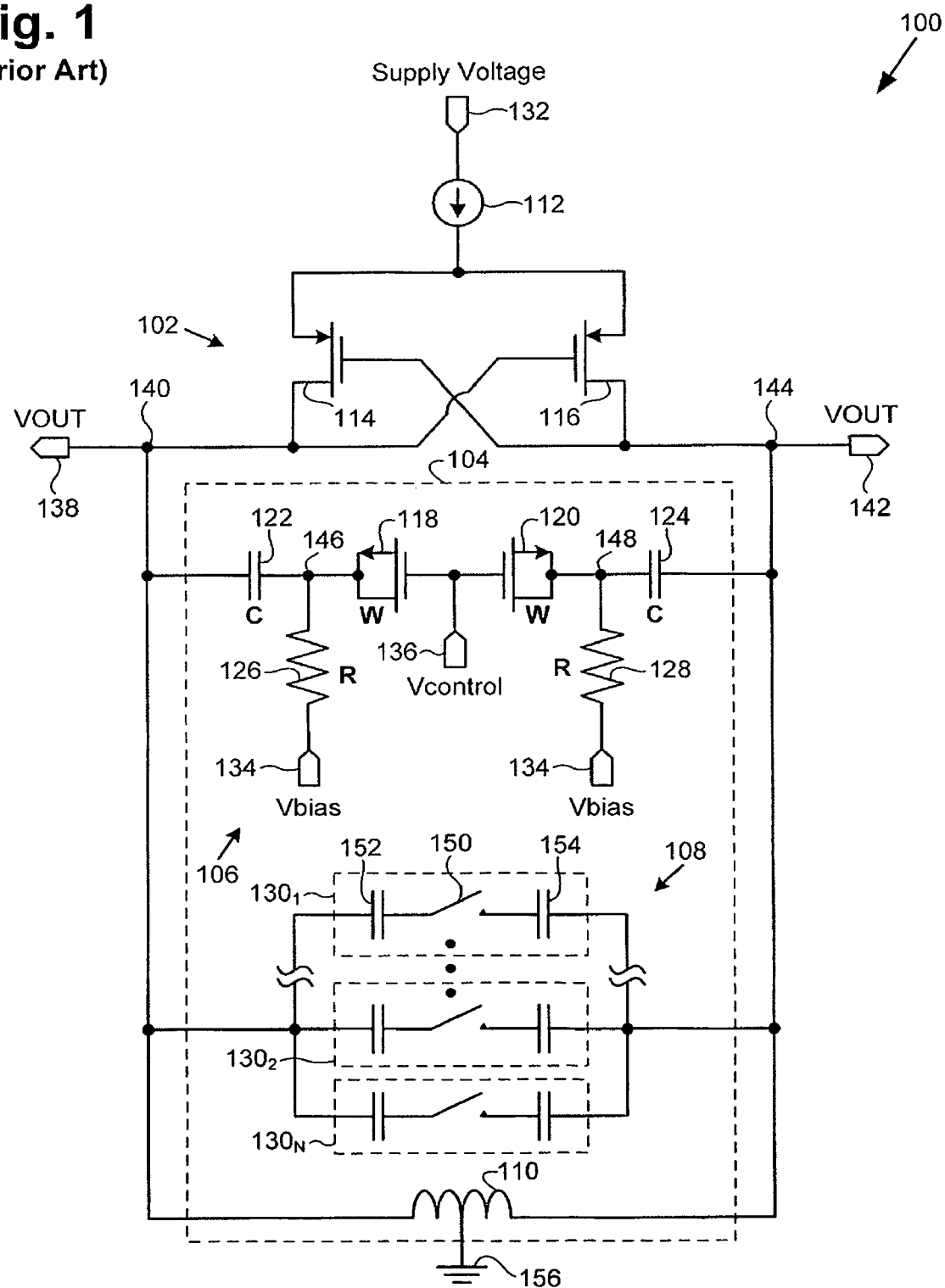
FIG. 1 shows a circuit diagram of a conventional exemplary voltage controlled oscillator including a conventional exemplary varactor circuit.

FIG. 1 shows a circuit diagram of a conventional exemplary VCO (voltage controlled oscillator) including a conventional exemplary varactor circuit. Conventional VCO 100 includes transconductance (gm) stage 102, tank circuit 104, which includes conventional varactor circuit 106, capacitor array 108, and inductor 110, and current source 112. Transconductance stage 102 includes transistors 114 and 116, conventional varactor circuit 106 includes varactors 118 and 120, capacitors 122 and 124, and resistors 126 and 128, and capacitor array 108 includes capacitor banks $130_1$, $130_2$, ..., $130_N$. Conventional VCO 100, which is a differential VCO, can be utilized in communications devices, such as cell phones, Bluetooth devices, and wireless LANs, as well as other types of electronic devices that require a VCO.

Conventional VCO 100 can be configured to receive supply voltage 132 (e.g. VDD), bias voltage (Vbias) 134, and control voltage (Vcontrol) 136 and generate a voltage output (VOUT) 138 at node 140 and a voltage output (VOUT) 142 at node 144, where the voltage outputs (i.e. VOUT 138 and VOUT 142) are differential outputs. For example, VOUT 138 may be designated as the positive voltage output of conventional VCO 100, while VOUT 142 may be designated as the negative voltage output of conventional VCO 100. Nodes 140 and 144 can be referred to as "differential output nodes" in the present application.

As shown in FIG. 1, supply voltage 132 (e.g. VDD) is coupled to a first terminal of current source 112 and a second terminal of current source 112 is coupled to the sources of transistors 114 and 116, which can each be, for example, a P channel MOS (PMOS) transistor. Current source 112 can provide a bias current as required for the operation of conventional VCO 100. Also shown in FIG. 1, the gate of transistor 116 is coupled to the drain of transistor 114 at node 140 and the gate of transistor 114 is coupled to the drain of transistor 116 at node 144. Further shown in FIG. 1, a first terminal of capacitor 122 is coupled to node 140, a second terminal of capacitor 122 is coupled to a first terminal of resistor 126 and a first terminal of varactor 118 at node 146, and a second terminal of resistor 126 is coupled to bias voltage (Vbias) 134. Also shown in FIG. 1, a first terminal of capacitor 124 is coupled to node 144, a second terminal of capacitor 124 is coupled to a first terminal of resistor 128 and a first terminal of varactor 120 at node 148, a second terminal of resistor 128 is coupled to Vbias 134, and the second terminals of varactors 118 and 120 are coupled to control voltage (Vcontrol) 136.

Capacitors 122 and 124 can each have a capacitance equal to C and resistors 126 and 128 can each have a resistance equal to R. Varactors 118 and 120, which can be AMOS (accumulation mode MOS) varactors, can each be formed from an N channel MOS (NMOS) transistor, where the source and drain of the NMOS transistor are shorted together to form a first varactor terminal and the gate of the NMOS transistor forms a second varactor terminal. Varactors 118 and 120 can each operate as a voltage controlled capacitor, where a differential voltage applied between the first and second terminals can determine the capacitance across each varactor. Varactors 118 and 120 can each have a gate width equal to W, which refers to the total gate finger width of each varactor, and can each have a gate length equal to L. The capacitance of each of varactors 118 and 120 is proportional to the gate area (i.e. W·L) of the varactor. By setting L equal to 1.0, the capacitance of each of varactors 118 and 120 can be proportional to W (i.e. the varactor gate width). Vcontrol 136 can be a DC voltage that can be varied so as to control the capacitance of each of varactors 118 and 120.

Further shown in FIG. 1, capacitor banks $130_1$, $130_2$, ..., $130_N$, which can provide coarse tuning for conventional VCO 100, are coupled between nodes 140 and 144. Each of capacitor banks $130_1$, $130_2$, ..., $130_N$ can include a switch coupled between two capacitors. For example, capacitor bank $130_1$ includes switch 150, which is coupled between capacitors 152 and 154. Capacitor array 108 can include "N" capacitor banks, where "N" can be selected to achieve a desired tuning range for conventional VCO 100. Also shown in FIG. 1, a first terminal of inductor 110 is coupled to node 140, a second terminal of inductor 110 is coupled to node 144, and a center tap of inductor 110 is coupled to ground 156. Inductor 110 provides an inductance for tank circuit 104.

During the operation of conventional VCO 100, capacitor banks $130_1$, $130_2$, ..., $130_N$ of capacitor array 108 can be utilized to tune between different bands in a predetermined frequency range. Once a band has been selected by capacitor array 108, conventional varactor circuit 106 can be adjusted to tune to a desired frequency within the selected band by utilizing Vcontrol 136 to vary the capacitance of each of varactors 118 and 120. AC voltages having the desired frequency can be outputted at respective nodes 140 and 144 (differential output nodes) as VOUT 138 and VOUT 142, where VOUT 138 is 180.0 degrees out of phase with VOUT 142.

In conventional VCO 100, phase noise, which is undesirable, can be reduced by increasing the Q (quality factor) of tank circuit 104, which is dependent on the Q of inductor 110 and the Q of varactors 118 and 120 in conventional varactor circuit 106. Thus, phase noise can be reduced in conventional VCO 100 by increasing the Q of inductor 110 and/or the Q of conventional varactor circuit 106. The Q of inductor 110 can be increased, for example, by utilizing multiple metal layers to form inductor 110. The Q of each of varactors 118 and 120 is inversely proportional to the varactor's capacitance, which is proportional to the gate area (i.e. W (gate width)·L (gate length)). By setting L equal to one (1.0), the capacitance of each of varactors 118 and 120 can be proportional to W (i.e. the gate width). Thus, the Q of each of varactors 118 and 120 can be increased by reducing the capacitor of each varactor by reducing its gate width (W).

However, the tuning gain (i.e. KVCO) of conventional VCO 100, which specifies the amount of change in VCO output frequency that will result from a change in control voltage (i.e. Vcontrol 136), is proportional to the capacitance that varactors 118 and 120 present to tank circuit 104. Thus, decreasing the capacitance of each of varactors 118 and 120 so as to increase the varactor's Q can also cause a reduction in the KVCO of conventional VCO 100, which is undesirable.

Figure 2:
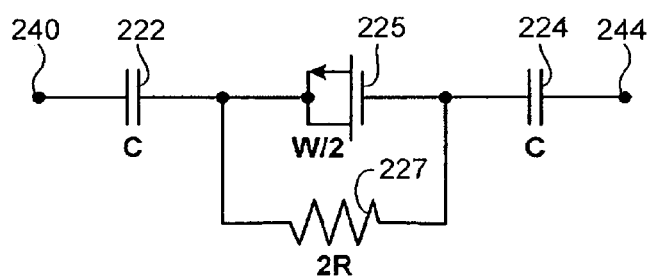
FIG. 2 shows a circuit diagram of a conventional equivalent varactor circuit corresponding to the conventional exemplary varactor circuit in FIG. 1.

FIG. 2 shows a circuit diagram of a conventional equivalent varactor circuit corresponding to conventional varactor circuit 106 in FIG. 1. In FIG. 2, conventional equivalent varactor circuit 206 corresponds to conventional varactor circuit 106 in conventional VCO 100. In conventional equivalent varactor circuit 206, capacitors 222 and 224 and nodes 240 and 244 correspond, respectively, to capacitors 122 and 124 and nodes 140 and 144 in conventional varactor circuit 106 in FIG. 1. As shown in FIG. 2, capacitor 222 is coupled between node 240 and a first terminal of varactor 225, capacitor 224 is coupled between node 244 and a second terminal of varactor 225, and resistor 227 is coupled across varactor 225.

Capacitors 122 and 124 can have a much larger capacitance than varactors 118 and 120 in conventional varactor circuit 106 in FIG. 1. Thus, at high frequency, capacitors 122 and 124 can be ignored. Thus, varactor 225 in equivalent circuit 206 has a capacitance that corresponds to the series capacitance of varactors 118 and 120 in conventional varactor circuit 106 in FIG. 1. As discussed above, the gate width (i.e. W) of each of varactors 118 and 120 is proportional to the varactor's capacitance. Thus, varactor 225 can have a capacitance equal to one half of the capacitance of varactor 118 or varactor 120 and varactor 225 can have a gate width equal to W/2.

In FIG. 1, since Vbias 134 is a DC bias voltage, it can provide an AC ground. Thus, for AC voltages (e.g. VOUT 138 and VOUT 142), resistor 126 and resistor 128 in conventional varactor circuit 106 can be coupled together to provide resistor 227, which can have a resistance equal to 2R (i.e. the sum of resistance R of resistor 126 and resistance R of resistor 128). Conventional equivalent varactor circuit 206, which corresponds to conventional varactor circuit 106 in FIG. 1, will be compared below to an exemplary equivalent varactor circuit corresponding to an embodiment of the invention's differential varactor circuit.

Figure 3:
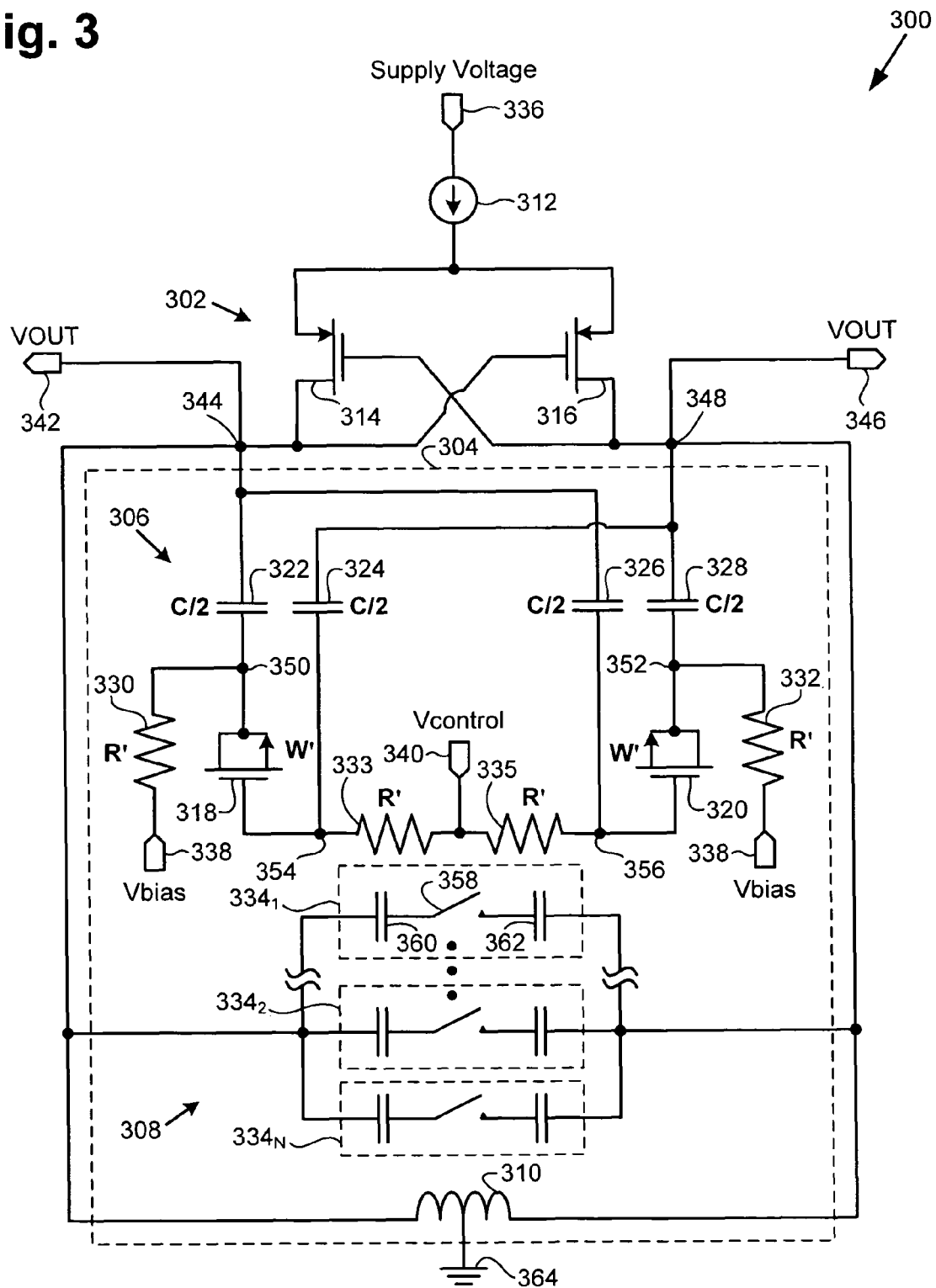
FIG. 3 shows a circuit diagram of an exemplary voltage controlled oscillator including an exemplary differential varactor circuit in accordance with one embodiment of the present invention.

FIG. 3 shows a circuit diagram of an exemplary VCO including an exemplary differential varactor circuit in accordance with one embodiment of the present invention. VCO 300 includes transconductance (Gm) stage 302, tank circuit 304, which includes differential varactor circuit 306, capacitor array 308, and inductor 310, and current source 312. Transconductance stage 302 includes transistors 314 and 316, differential varactor circuit 306 includes varactors 318 and 320, capacitors 322, 324, 326, and 328, and resistors 330, 332, 333, and 335, and capacitor array 308 includes capacitor banks $334_1$, $334_2$, ..., $334_N$. VCO 300, which is a differential VCO, can be utilized in, for example, communications devices, such as cell phones, Bluetooth devices, and wireless LANs. However, VCO 300 can be generalized utilized in any electronic device that requires a VCO, such as a differential VCO.

VCO 300 can be configured to receive supply voltage 336 (e.g. VDD), bias voltage (Vbias) 338, and control voltage (Vcontrol) 340 and to provide output voltage (VOUT) 342 at node 344 and output voltage (VOUT) 346 at node 348, where VOUT 342 and VOUT 346 are differential outputs. For example, VOUT 342 may be designated as the positive voltage output of VCO 300, while VOUT 346 may be designated as the negative voltage output of VCO 300. An AC voltage (i.e. VOUT 342) provided at node 344 can be 180.0 degrees out of phase with an AC voltage (i.e. VOUT 346) provided at node 348. Nodes 344 and 348 can be referred to as "differential output nodes" in the present application.

As shown in FIG. 3, supply voltage 336 (e.g. VDD) is coupled to a first terminal of current source 312 and a second terminal of current source 312 is coupled to the sources of transistors 314 and 316. Current source 312 can provide a bias current as required for the operation of VCO 300. Transistors 314 and 316 can each be, for example, a PMOS transistor. In another embodiment, transistors 314 and 316 may each be an NMOS transistor. Also shown in FIG. 3, the gate of transistor 316 is coupled to the drain of transistor 314 at node 344 and the gate of transistor 314 is coupled to the drain of transistor 316 at node 348. Further shown in FIG. 3, first terminals of capacitors 322 and 326 are coupled to node 344, first terminals of capacitors 324 and 328 are coupled to node 348, a second terminal of capacitor 322 is coupled to first terminals of resistor 330 and varactor 318 at node 350, and a second terminal of capacitor 328 is coupled to first terminals of resistor 332 and varactor 320 at node 352.

Capacitors 322, 324, 326, and 328 can each have a capacitance equal to C/2 and resistors 330 and 332 can each have a resistance equal to R'. In one embodiment of the invention, varactors 318 and 320 can be accumulation mode MOS varactors, where each varactor can be formed from an NMOS transistor. The source and drain of the NMOS transistor can be shorted together to form a first varactor terminal and the gate of the NMOS transistor can form a second varactor terminal. In another embodiment, varactors 318 and 320 can be inversion mode MOS varactors, where each varactor can be formed from a PMOS transistor. Varactors 318 and 320 can each operate as a voltage controlled capacitor, where a differential voltage applied between the first and second terminals of the varactor can determine the capacitance across the varactor. Varactors 318 and 320 can each have a gate width equal to W', which refers to the total gate finger width of each varactor, and can each have a gate length equal to L. The capacitance of each of varactors 318 and 320 is proportional to the varactor gate area (i.e. W'·L). By setting L equal to 1.0, the capacitance of each of varactors 318 and 320 can be proportional to W' (i.e. the varactor gate width).

Also shown in a second terminal of varactor 318 is coupled to a second terminal of capacitor 324 and a first terminal of resistor 333 at node 354, a second terminal of varactor 320 is coupled to a second terminal of capacitor 326 and a first terminal of resistor 335 at node 356, second terminals of resistors 330 and 332 are coupled to Vbias 338, and second terminals of resistors 333 and 335 are coupled to Vcontrol 340. The resistance of each of resistors 333 and 335 can be equal to R'. Vcontrol 340 can be a DC voltage that can be varied so as to control the capacitance of each of varactors 318 and 320.

Further shown in FIG. 3, capacitor banks $334_1$, $334_2$, ..., $334_N$, which can provide coarse tuning for VCO 300, are coupled between nodes 344 and 348 (i.e. differential output nodes). Each of capacitor banks $334_1$, $334_2$, ..., $334_N$ can include a switch coupled between two capacitors. For example, capacitor bank $334_1$ includes switch 358, which is coupled between capacitors 360 and 362. Capacitor array 308 can include "N" capacitor banks, where "N" can be selected to achieve a desired tuning range for VCO 300. In one embodiment, capacitor array 308 may not be utilized. Only capacitors 360 and 362 and switch 358 are specifically discussed in the present application so as to preserve brevity. Also shown in FIG. 3, a first terminal of inductor 310 is coupled to node 344, a second terminal of inductor 310 is coupled to node 348, and the center tap of inductor 310 is coupled to ground 364.

During the operation of VCO 300, capacitor banks $334_1$, $334_2$, ..., $334_N$ of capacitor array 308 can be utilized to tune between different frequency bands in a predetermined frequency range. Once a band has been selected by capacitor array 308, differential varactor circuit 306 can be adjusted to tune VCO 300 to a desired output frequency within the selected band by utilizing Vcontrol 340 to vary the capacitance of varactors 318 and 320. Differential AC output voltages having the desired frequency can be outputted at respective nodes 344 and 348 as VOUT 342 and VOUT 346.

In differential varactor circuit 306, an AC output voltage (i.e. VOUT 342) at node 344 is coupled to node 350 via capacitor 322 so as to provide a voltage swing at one terminal of varactor 318, and an AC output voltage (i.e. VOUT 346) at node 348 is coupled to node 354 via capacitor 324 so as to provide a voltage swing at the other terminal of varactor 318. Similarly, the AC output voltage at node 344 is coupled to node 356 via capacitor 326 so as to provide a voltage swing at one terminal of varactor 320, and the AC output voltage at node 348 is coupled to node 352 via capacitor 328 so as to provide a voltage swing at the other terminal of varactor 320. Since the AC output voltages at nodes 344 and 348 are anti-phase (i.e. 180.0 degrees out of phase), the effective voltage swing across each of varactors 318 and 320 will be twice the voltage swing provided by either the AC output voltage at node 344 (i.e. VOUT 342) or the AC output voltage at node 348 (i.e. VOUT 346)).

By effectively doubling the voltage swing across each of varactors 318 and 320, the gate width of each of varactors 318 and 320 can be significantly reduced for a specified value of KVCO (VCO tuning gain). As a result, an embodiment of the invention can increase the Q of each of varactors 318 and 320 without reducing KVCO or altering the total impedance across nodes 344 and 348 (i.e. the differential output nodes). Thus, by increasing the Q of each of varactors 318 and 320, the phase noise of VCO 300 can be reduced without undesirably reducing the KVCO (i.e. the tuning gain) of VCO 300.

In differential varactor circuit 306, resistor 333 is provided between Vcontrol 340 and node 354 so as to prevent Vcontrol 340 from overriding the voltage swing provided by VOUT 346 at node 354. Similarly, resistor 335 is provided between Vcontrol 340 and node 356 so as to prevent Vcontrol 340 from overriding the voltage swing provided by VOUT 342 at node 356. To provide a symmetrical waveform across varactor 318, the resistance of resistor 330 can be substantially equal to the resistance of resistor 333 in an embodiment of the invention. Similarly, in an embodiment of the invention, the resistance of resistor 332 can be substantially equal to the resistance of resistor 335 so as to provide a symmetrical waveform across varactor 320. The increased varactor Q provided by an embodiment of the invention's differential varactor circuit compared to the varactor Q provided by conventional varactor circuit 106 in FIG. 1 will be discussed below.

Figure 4:
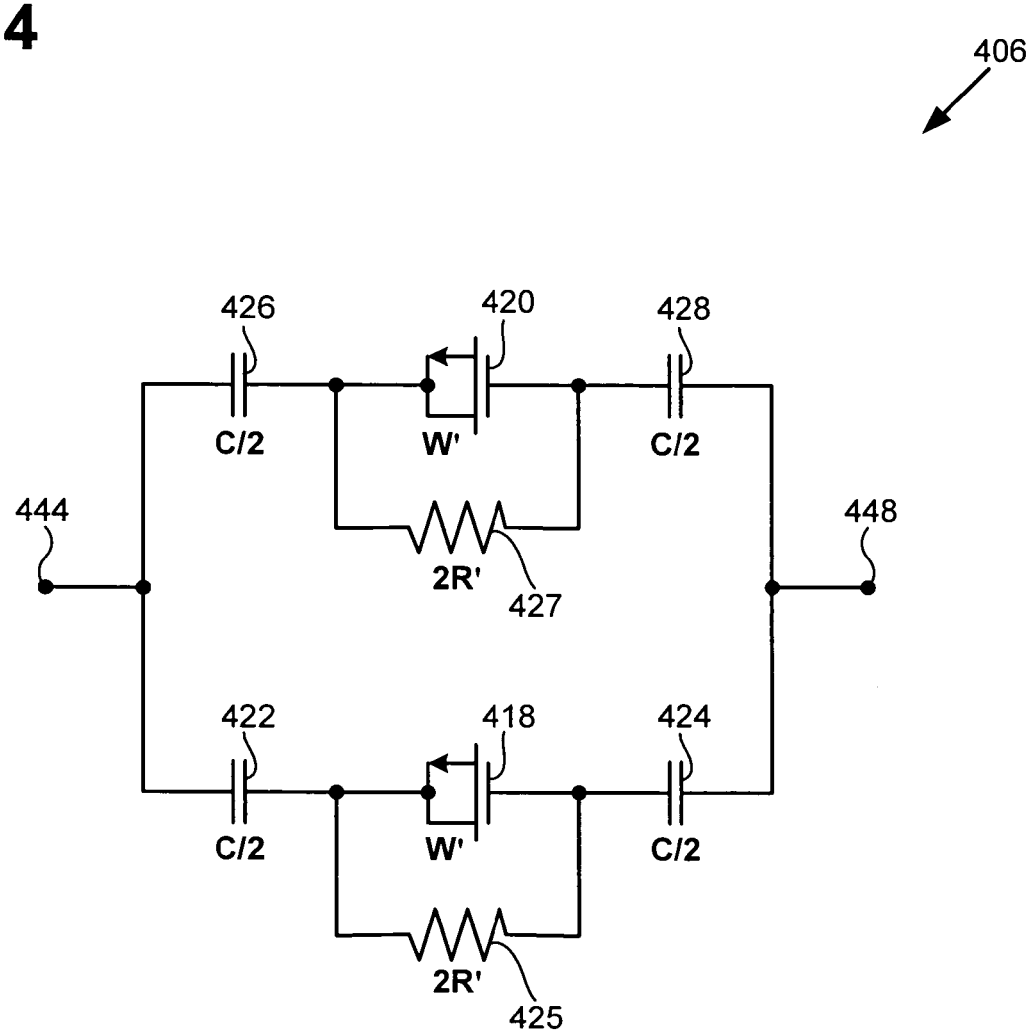
FIG. 4 shows a circuit diagram of an exemplary simplified differential varactor circuit corresponding to the exemplary varactor circuit in FIG. 3.

FIG. 4 shows a circuit diagram of a simplified differential varactor circuit corresponding to differential varactor circuit 306 in FIG. 3. In FIG. 4, simplified differential varactor circuit 406 corresponds to differential varactor circuit 306 in VCO 300. In simplified differential varactor circuit 406, varactors 418 and 420, capacitors 422, 424, 426, and 428, and nodes 444 and 448 correspond, respectively, to varactors 318 and 320, capacitors 322, 324, 326, and 328, and nodes 344 and 348 in differential varactor circuit 306 in FIG. 3. As shown in FIG. 4, resistor 425 is coupled across varactor 418 and resistor 427 is coupled across varactor 420.

Since Vbias 338 and Vcontrol 340 in FIG. 3 are DC voltages, they can each provide an AC ground. Thus, for an AC voltage, resistors 330 and 333 in differential varactor circuit 306 in FIG. 3 can be coupled together and resistors 332 and 335 can be coupled together. Thus, in simplified differential varactor circuit 406, the resistance of resistor 425 can be equal to the sum of the resistances of resistors 330 and 333 in FIG. 3 and the resistance of resistor 427 can be equal to the sum of the resistances of resistors 332 and 335. Since each of resistors 330, 332, 333, and 335 has a resistance equal to R', the resistance of each of resistors 425 and 427 can be equal to 2R'. Simplified differential varactor circuit 406 in FIG. 4 can be utilized to provide an equivalent circuit as shown in FIG. 5.

Figure 5:
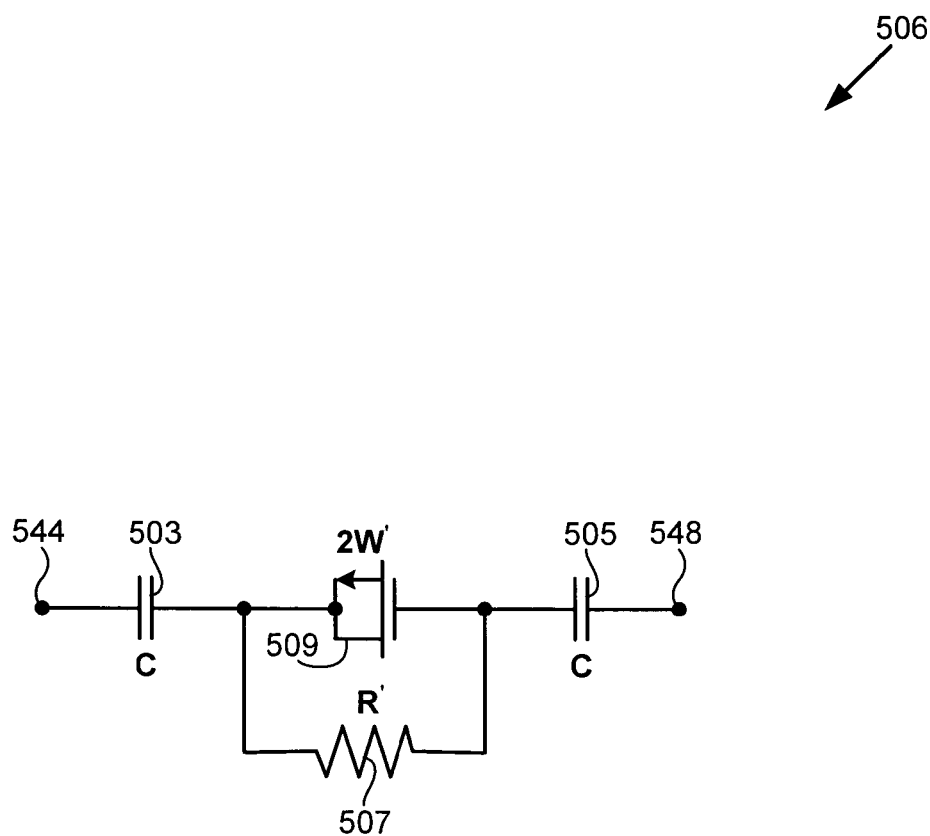
FIG. 5 shows a circuit diagram of an equivalent varactor circuit corresponding to the exemplary simplified varactor circuit in FIG. 4.

FIG. 5 shows a circuit diagram of an equivalent varactor circuit corresponding to simplified differential varactor circuit 406 in FIG. 4. In equivalent varactor circuit 506, nodes 544 and 548 correspond, respectively, to nodes 444 and 448 in simplified differential varactor circuit 406 in FIG. 4. Equivalent varactor circuit 506 includes capacitors 503 and 505, resistor 507, and varactor 509. As shown in FIG. 5, resistor 507 is coupled across varactor 509, capacitor 503 is coupled between one terminal of varactor 509 and node 544, and capacitor 505 is coupled between the other terminal of varactor 509 and node 548.

In FIG. 4, varactors 418 and 420 are situated in parallel branches of simplified differential varactor circuit 406. Also, capacitors 426 and 428 each have a much larger capacitance than varactor 420 and capacitors 422 and 424 each have a much larger capacitance than varactor 418. Capacitors 426 and 428 and varactor 420 are coupled between nodes 444 and 448 and capacitors 422 and 424 and varactor 418 are also coupled between nodes 444 and 448 of simplified differential varactor circuit 406. Thus, the capacitance of capacitor 503 can be equal to the sum of the capacitances of capacitors 422 and 426, the capacitance of varactor 509 can be equal to the sum of the capacitances of varactors 418 and 420, and the capacitance of capacitor 505 can be equal to the sum of the capacitances of capacitors 424 and 428. Thus, capacitors 503 and 505 can each have a capacitance equal to C. Since the gate width W' of each of varactors 418 and 420 is proportional to the varactor's capacitance, varactor 509 in FIG. 5 can have a gate width equal to 2W' (i.e. the sum of the gate widths of varactors 418 and 420).

In equivalent varactor circuit 506, resistor 507 corresponds to resistors 425 and 427 in FIG. 4. Since resistors 425 and 427 are situated in parallel branches of simplified differential varactor circuit 406 in FIG. 4, resistor 507 can have a resistance equal to R' (i.e. the sum of the reciprocal of the resistance of resistor 425 (½R') and the reciprocal of the resistance of resistor 427 (½R')).

The impedance across nodes 544 and 548 of equivalent varactor circuit 506 can be equal to the impedance across nodes 240 and 244 of conventional equivalent varactor circuit 206 in FIG. 2 by selecting gate width 2W' of varactor 509 in equivalent varactor circuit 506 to be equal to W/2 (i.e. the gate width of varactor 225 in conventional equivalent varactor circuit 206) and selecting the resistance R' of resistor 507 to be equal to 2R (i.e. the resistance of resistor 227 in conventional equivalent varactor circuit 206). Thus, for the impedance across nodes 544 and 548 of equivalent varactor circuit 506 to be equal to the impedance across nodes 240 and 244 of conventional equivalent varactor circuit 206, varactor 509 can have a gate width W' equal to W/4, where W is the gate width of each of varactors 118 and 120 in conventional varactor circuit 106 in FIG. 1. Thus, since W' is the gate width of each of varactors 318 and 320 in differential varactor circuit 306 in FIG. 3, varactors 318 and 320 in FIG. 3 can each have a gate width equal to W/4 (i.e. 25.0 percent of the gate width of each of varactors 118 and 120).

Equivalent varactor circuit 506 corresponds to differential varactor circuit 306 in FIG. 3 and conventional equivalent varactor circuit 206 corresponds to conventional varactor circuit 106 in FIG. 1. Thus, by utilizing varactors having a gate width equal to 25.0 percent of the gate width of the varactors in conventional varactor circuit 106, an embodiment of the invention's differential varactor circuit 306 can provide the same impedance as conventional varactor circuit 106, where the varactors in differential varactor circuit 306 and conventional varactor circuit 106 have the same gate length. Since the impedance across differential varactor circuit 306 is set to be the same as the impedance across conventional varactor circuit 106, the KVCO (i.e. tuning gain) of VCO 300 can be the same as the KVCO of conventional VCO 100.

Thus, by utilizing a differential varactor configuration, an embodiment of the invention's differential varactor circuit 306 can provide varactors having reduced gate width (i.e. reduced size) compared to varactors in conventional varactor circuit 106 without causing a reduction in VCO tuning gain. Thus, by utilizing a differential varactor configuration, wherein each terminal of each varactor is coupled to one of two differential VCO outputs, an embodiment of the invention's differential varactor circuit 306 can reduce varactor size without causing a reduction in VCO tuning gain.

To provide the same impedance across equivalent varactor circuit 506 as conventional varactor circuit 206, the resistance R' of resistor 507 is selected to be equal to 2R, which is the resistance of resistor 227 in conventional varactor circuit 206. Thus, to achieve the same impedance, the resistance in differential varactor circuit 306 in FIG. 3 is increased compared to the resistance in conventional varactor circuit 106 in FIG. 1. However, the die area consumed by the increased resistance in differential varactor circuit 306 is significantly less than the die area saved by the reduction in gate width achieve by an embodiment of the invention's differential varactor circuit.

The Q (quality factor) of a varactor, such as an AMOS (accumulation mode MOS) varactor or an IMOS (inversion mode MOS) varactor, can be defined by the equation:

$$Q(\text{varactor}) = 12/\omega_o \cdot C_{ox}(R_{sq,ch} \cdot L_f^2 + R_{sq,poly} \cdot W_f^2) \qquad \text{equation (1)}$$

where "$\omega_o$" is the frequency, "$C_{ox}$" is the gate oxide capacitance per area, "$R_{sq\_ch}$" is the sheet resistance of the channel region, "$L_f$" is the length of each gate finger, "$R_{sq,poly}$" is the sheet resistance of the polysilicon gate, and "$W_f$" is the width of each gate finger. Thus, as shown in equation (1), the Q of a varactor, such as an AMOS or IMOS varactor, can be increased by reducing $L_f$ (i.e. gate length) and/or reducing $W_f$ (i.e. gate width) of the varactor. Thus, by reducing varactor gate width, which reduces varactor size, an embodiment of the invention's differential varactor circuit 306 in FIG. 3 can provide an increased varactor Q compared to conventional varactor circuit 106 in FIG. 1, where the varactor gate length is the same (e.g. equal to 1.0) in each circuit. While reducing varactor size, the invention's differential varactor circuit can provide at least a 50.0 percent increase in varactor Q for VCO frequencies in a range of, for example, from approximately 1.0 GHz to approximately 10.0 GHz compared to a conventional varactor circuit, such as conventional varactor circuit 106 in FIG. 1.

By providing a differential varactor circuit having an increased Q, an embodiment of the invention also provides reduced VCO phase noise. Also, an embodiment of the invention's differential varactor circuit can provide reduced VCO phase noise without undesirably increasing VCO power consumption. Thus, an embodiment of the invention's differential varactor circuit can be advantageously utilized in VCOs in low power applications, such as cell phones and other wireless communications devices.

Thus, as discussed above, by coupling each terminal of each varactor to one of two differential VCO outputs, an embodiment of the invention's differential varactor circuit allows varactor size to be reduced by reducing varactor gate width, thereby advantageously increasing varactor Q without undesirably decreasing VCO tuning gain (i.e. KVCO). Thus, an embodiment of the invention's differential varactor circuit can advantageously provide reduced VCO phase noise without undesirably increasing VCO power consumption.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A differential varactor circuit for a voltage controlled oscillator, said voltage controlled oscillator having two differential outputs, said differential varactor circuit comprising:
    a first varactor having first and second terminals and a second varactor having first and second terminals;
    each of said first and second terminals of said first varactor and each of said first and second terminals of said second varactor being coupled to one of said two differential outputs of said voltage controlled oscillator through paths not including both said first and said second varactors, thereby allowing a size of each of said first and second varactors to be reduced so as to increase varactor quality factor.

2. The differential varactor circuit of claim 1, wherein said each of said first and second terminals of said first varactor is coupled to said one of said two differential outputs of said voltage controlled oscillator by a capacitor.

3. The varactor differential tuning circuit of claim 1, wherein said each of said first and second terminals of said second varactor is coupled to said one of said two differential outputs of said voltage controlled oscillator by a capacitor.

4. The differential varactor circuit of claim 1 further comprising a first resistor coupled between said first terminal of said first varactor and a bias voltage and a second resistor coupled between said second terminal of said first varactor and a control voltage.

5. The differential varactor circuit of claim 4, wherein a resistance of said first resistor is substantially equal to a resistance of said second resistor.

6. The differential varactor circuit of claim 4 further comprising a third resistor coupled between said first terminal of said second varactor and said bias voltage and a fourth resistor coupled between said second terminal of said second varactor and said control voltage.

7. The differential varactor circuit of claim 1, wherein a voltage swing at said first terminals of said first and second varactors is 180.0 degrees out of phase with a voltage swing at said second terminals of said first and second varactors.

8. The differential varactor circuit of claim 1, wherein said first varactor has a first gate width and said second varactor has a second gate width, wherein said first gate width is substantially equal to said second gate width.

9. The differential varactor circuit of claim 1, wherein said each of said first and second varactors is an accumulation mode varactor.

10. The differential varactor circuit of claim 1, wherein said each of said first and second varactors is an inversion mode varactor.

11. A voltage controlled oscillator having two differential outputs, said voltage controlled oscillator comprising:
    a tank circuit including a differential varactor circuit, said differential varactor circuit comprising a first varactor having first and second terminals and a second varactor having first and second terminals;
    each of said first and second terminals of said first varactor and each of said first and second terminals of said second varactor being coupled to one of said two differential outputs of said voltage controlled oscillator through paths not including both said first and said second varactors, thereby allowing a size of each of said first and second varactors to be reduced so as to increase varactor quality factor.

12. The voltage controlled oscillator of claim 11, wherein said each of said first and second terminals of said first varactor is coupled to said one of said two differential outputs of said voltage controlled oscillator by a capacitor.

13. The voltage controlled oscillator of claim 11, wherein said each of said first and second terminals of said second varactor is coupled to said one of said two differential outputs of said differential outputs by a capacitor.

14. The voltage controlled oscillator of claim 11, wherein said differential varactor circuit further comprises a first resistor coupled between said first terminal of said first varactor and a bias voltage and a second resistor coupled between said second terminal of said first varactor and a control voltage.

15. The voltage controlled oscillator of claim 14, wherein a resistance of said first resistor is substantially equal to a resistance of said second resistor.

16. The voltage controlled oscillator of claim 14, wherein said differential varactor circuit further comprises a third resistor coupled between said first terminal of said second varactor and said bias voltage and a fourth resistor coupled between said second terminal of said second varactor and said control voltage.

17. The voltage controlled oscillator of claim 11, wherein a voltage swing at said first terminals of said first and second varactors is 180.0 degrees out of phase with a voltage swing at said second terminals of said first and second varactors.

18. The voltage controlled oscillator of claim 11, wherein said each of said first and second varactors is an accumulation mode varactor.

19. The voltage controlled oscillator of claim 11, wherein said each of said first and second varactors is an inversion mode varactor.

20. The voltage controlled oscillator of claim 11 further comprising a transconductance stage coupled to said tank circuit.

* * * * *